US012701679B2

(12) United States Patent
Gwin et al.

(10) Patent No.: US 12,701,679 B2
(45) Date of Patent: Aug. 4, 2026

(54) ELECTRONIC SYSTEM LIQUID COOLING APPARATUS WITH SUSTAINED HEAT OUTPUT FOR ENERGY RE-USE

(71) Applicant: Intel Corporation, Santa Clara, CA (US)

(72) Inventors: Paul J. Gwin, Orangevale, CA (US); Ra'anan Sover, Tirat Carmel (IL); James D. Williams, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 246 days.

(21) Appl. No.: 17/705,245

(22) Filed: Mar. 25, 2022

(65) Prior Publication Data

US 2022/0217876 A1 Jul. 7, 2022

Related U.S. Application Data

(60) Provisional application No. 63/320,577, filed on Mar. 16, 2022.

(51) Int. Cl.
*H05K 7/20* (2006.01)
*G05D 23/19* (2006.01)

(52) U.S. Cl.
CPC ..... *H05K 7/20836* (2013.01); *G05D 23/1917* (2013.01); *H05K 7/20254* (2013.01);
(Continued)

(58) Field of Classification Search
CPC ........... H05K 7/20836; H05K 7/20254; H05K 7/20263; H05K 7/2072; H05K 7/20781;
(Continued)

(56) References Cited

U.S. PATENT DOCUMENTS 5,896,922 A * 4/1999 Chrysler ................. F25B 41/20
165/146
7,724,524 B1 5/2010 Campbell et al.
(Continued)

FOREIGN PATENT DOCUMENTS

GB 2576032 B 4/2021
GB 2576030 B 12/2021
(Continued)

OTHER PUBLICATIONS

Prucnal, "Doing More with Less: Cooling Computers with Immersion Pays Off," National Security Agency, The Next Wave, vol. 20, No. 2, 2013, pp. 20-29, 10 pages.
(Continued)

*Primary Examiner* — Joel M Attey
(74) *Attorney, Agent, or Firm* — Hanley, Flight & Zimmerman, LLC

(57) ABSTRACT

A method is described. The method includes monitoring a combined workload of electronic devices that are being cooled by a secondary loop. The method includes flowing a first portion of secondary fluid through the secondary loop's heat exchanger and bypassing a second portion of the secondary fluid through the secondary loop's heat exchanger. The method includes, in response to an increase in the combined workload of the electronic devices, adjusting a first setting of a valve to increase the first portion and decrease the second portion. The method includes, in response to a decrease in the combined workload of the electronic devices, adjusting a second setting of the valve to decrease the first portion and increase the second portion.

21 Claims, 9 Drawing Sheets

(52) U.S. Cl.
CPC ..... *H05K 7/20263* (2013.01); *H05K 7/20272* (2013.01); *H05K 7/20781* (2013.01)

(58) Field of Classification Search
CPC .......... H05K 7/20809; H05K 7/20818; H05K 7/20281
USPC ............................................ 165/280, 104.33
See application file for complete search history.

(56) References Cited

U.S. PATENT DOCUMENTS

| | | | |
|---|---|---|---|
| 10,925,188 B1 | 2/2021 | Keehn et al. | |
| 11,096,313 B2 | 8/2021 | Amos et al. | |
| 2006/0047808 A1* | 3/2006 | Sharma ................. | G06F 9/5094 |
| | | | 709/224 |
| 2010/0118494 A1 | 5/2010 | Campbell et al. | |
| 2011/0060470 A1* | 3/2011 | Campbell .......... | G05D 23/1934 |
| | | | 700/282 |
| 2011/0315344 A1 | 12/2011 | Campbell et al. | |
| 2011/0315354 A1 | 12/2011 | Johnson | |
| 2011/0315355 A1 | 12/2011 | Campbell et al. | |
| 2012/0286514 A1 | 11/2012 | Graybill et al. | |
| 2013/0333865 A1* | 12/2013 | Goth .................. | H05K 7/20836 |
| | | | 165/104.31 |
| 2017/0127558 A1 | 5/2017 | Best | |
| 2017/0127563 A1* | 5/2017 | Chainer ............. | H05K 7/20818 |
| 2018/0027695 A1 | 1/2018 | Wakino et al. | |
| 2018/0299933 A1 | 10/2018 | Cui et al. | |
| 2019/0008078 A1 | 1/2019 | Waddell et al. | |
| 2019/0297747 A1 | 9/2019 | Wakino et al. | |
| 2019/0383559 A1 | 12/2019 | Aoki et al. | |
| 2020/0323100 A1 | 10/2020 | Chiu et al. | |
| 2020/0337176 A1 | 10/2020 | Aoki et al. | |
| 2020/0373223 A1 | 11/2020 | Chehade et al. | |
| 2021/0185850 A1 | 6/2021 | Kulkarni et al. | |
| 2021/0219454 A1 | 7/2021 | Cheng et al. | |
| 2022/0087050 A1 | 3/2022 | Jia et al. | |
| 2022/0201896 A1 | 6/2022 | Edmunds et al. | |
| 2022/0264768 A1 | 8/2022 | Horng et al. | |
| 2022/0264771 A1 | 8/2022 | Heydari | |
| 2022/0388929 A1 | 12/2022 | Petrov et al. | |
| 2022/0418156 A1 | 12/2022 | Cushen et al. | |

FOREIGN PATENT DOCUMENTS

| | | |
|---|---|---|
| GB | 2597525 A | 2/2022 |
| GB | 2601357 A | 6/2022 |

OTHER PUBLICATIONS

Green Revolution Cooling, "ICEraQ: Low-Cost, High-Efficiency, Modular, Racked-Based Cooling Solutions for Data Centers," 2019, Austin, Texas, 26 pages.

Icetope, "Ku: I Hybrid Chassis-level Liquid Cooling," Mar. 2, 2021, retrieved from <https://web.archive.org/web/20210302131610/https://www.iceotope.com/technologies/kul-hybrid-chassis-level-liquid-cooling/> on Apr. 7, 2026, 11 pages.

United States Patent and Trademark Office, "Non-Final Office Action," issued in connection with U.S. Appl. No. 17/185,681, dated Apr. 10, 2024, 24 pages.

United States Patent and Trademark Office, "Final Office Action,"issued in connection with U.S. Appl. No. 17/185,681, dated Oct. 22, 2024, 25 pages.

United States Patent and Trademark Office, "Advisory Action," Issued in connection with U.S. Appl. No. 17/185,681, dated Jan. 10, 2025, 3 pages.

United States Patent and Trademark Office, "Non-Final Office Action," issued in connection with U.S. Appl. No. 17/185,681, dated Jan. 29, 2025, 29 pages.

United States Patent and Trademark Office, "Final Office Action," issued in connection with U.S. Appl. No. 17/185,681, dated Aug. 6, 2025, 34 pages.

* cited by examiner

ELECTRONIC SYSTEM LIQUID COOLING APPARATUS WITH SUSTAINED HEAT OUTPUT FOR ENERGY RE-USE

RELATED CASES

This application claims the benefit of U.S. Provisional Application No. 63/320,577, entitled, "ELECTRONIC SYSTEM LIQUID COOLING APPARATUS WITH SUSTAINED HEAT OUTPUT FOR ENERGY RE-USE", filed Mar. 16, 2022, which is incorporated by reference in its entirety.

BACKGROUND

Thermal engineers face challenges, especially with respect to high performance data center computing, as both computers and networks continue to pack higher and higher levels of performance into smaller and smaller packages. Creative cooling solutions are therefore being designed to keep pace with the thermal requirements of such aggressively designed systems.

FIGURES

FIGS. 6a and 6b show pump rate and primary loop temperature as a function of combined electronic device workload;

DETAILED DESCRIPTION

Figure 1:
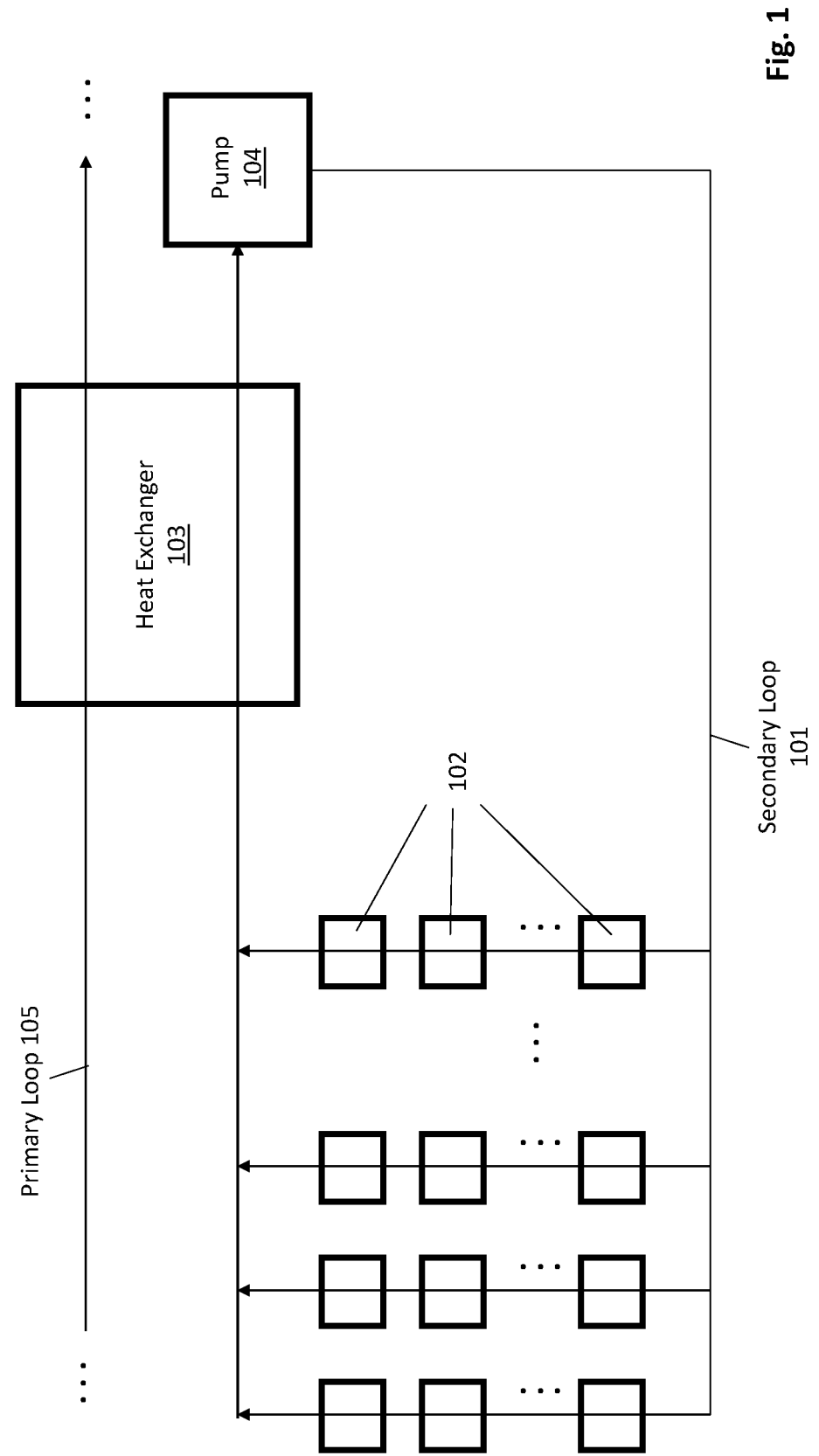
FIG. 1 shows a traditional liquid cooling system.

A basic liquid cooling approach, observed in FIG. 1, includes running "secondary" fluid 101 through the respective cold plates 102 of multiple electronic devices. The secondary fluid 101 warms in response to its absorption of heat from the cold plates 102 and then exits the cold plates 102. The secondary fluid 101 is then run to a heat exchanger 103 where it is cooled. The cooled secondary fluid 101 continues through a pump 104 and the process repeats.

Within the heat exchanger 103, heat is transferred from the secondary fluid 101 to another, separate "primary" fluid flow 105. The primary fluid 105 warms from the heat transfer, exits the heat exchanger 103 and is cooled elsewhere. The cooled primary fluid 101 is then returned to the heat exchanger 103 and the process repeats.

Government and/or other large entities are seeking ways to conserve and/or reduce energy consumption. As such, industrial engineers and/or other facilities focused professionals are seeking ways to reuse the heat that is dissipated by the electronic devices in a data center. A data center's electronic devices consume large amounts of electrical energy. A significant percentage of the electrical energy is then dissipated as heat, which, as described above is removed as warmed fluid.

Notably, the warmed liquid could be reused, e.g., in heating equipment, or any other application that can make use of a heat source or partial heat source. For example, if a data center that employs liquid cooling is operating near commercial and/or residential buildings in a colder climate, the warmed fluid could be pumped through the heaters of such buildings to warm them. As another example, if the data center (e.g., a micro data center) is near a cell tower/shelf with base stations and/or other equipment that reside outdoors in a cold climate (e.g., to effect a content delivery network and/or edge computing function/service), the warmed fluid generated by the liquid cooling system could be pumped through such equipment to keep their temperatures above their rated minimum.

A challenge, however, concerns variation of the warmed fluid's temperature. Specifically, the temperature of the warmed primary fluid 105 that emerges from the heat exchanger 103 can vary with the electrical power consumption and corresponding heat dissipation of the devices whose cold plates 102 warm the secondary fluid 101.

The challenge is exacerbated with constant high velocity fluid flows designed for worst case heat dissipation. Here, the faster the secondary fluid 101 flows through the cold plates 102 of the electronic devices, the greater the cooling efficiency of the secondary loop and, correspondingly, the greater the total power that can be removed. Similarly, the faster the primary fluid 105 flows through the heat exchanger 103, the greater the heat removal capacity of the primary loop. As such, the system's capacity to remove heat increases with increased fluid flow rates through the secondary 101 and primary 105 loops.

Unfortunately, traditional liquid cooling systems are designed with maximum primary 101 and secondary 105 fluid flow rates so that the system can adequately remove heat under worst case power consumption and corresponding heat dissipation conditions. That is, the fixed high velocity flow rates of the primary 101 and secondary 105 fluid flows are designed to handle a situation in which the electronic devices are operating at maximum power and maximum heat is being transferred into the secondary 101 and primary 105 fluids.

As such, in periods of operation where the electronic devices are operating well beneath their maximum power, the temperature of the primary fluid 105 falls beneath a level that is acceptable for any downstream infrastructure that relies on the warmed primary fluid 105 for heat.

Here, the temperature of a fluid is dependent upon how much heat a volume of fluid receives as it passes through the cold plates 102 (in the case of the secondary loop 101) or the heat exchanger 103 (in the case of the primary loop 105). More specifically, with high flow rates, when the electronic devices are dissipating maximum amounts of heat, the secondary 101 and primary fluids 105 receive sufficient amounts of heat to reach high fluidic temperatures even though, per unit volume, the fluids physically receive heat for only brief moments of time as they rapidly pass through the cold plates 102 (in the case of the second loop 101) or the heat exchanger 103 (in the case of the primary loop 105).

By contrast, again with high flow rates, when the electronic devices are dissipating minimal amounts of heat, the secondary/primary fluids pass through the plates/exchanger so quickly that they receive very little heat. As a consequence, the temperatures of the secondary 101 and primary fluids 105 declines.

Figure 2:
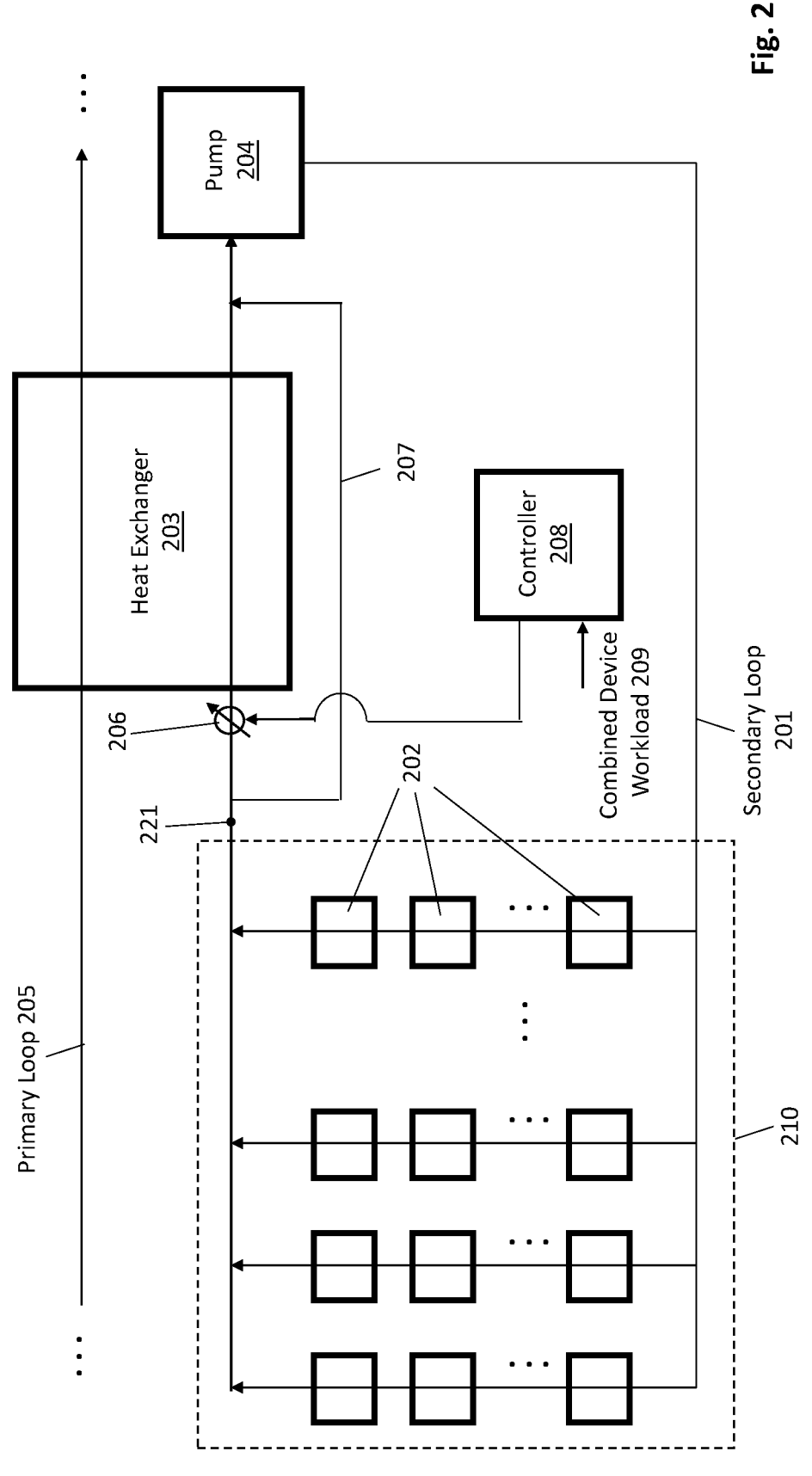
FIG. 2 shows an improved secondary loop liquid cooling system.

A solution, referring to FIG. 2, is to deliberately heat the fluid in the secondary loop 201 by bypassing the heat exchanger 203 when overall electronic device heat dissipation is low. Here, FIG. 2 shows an improved system in which a valve 206 is placed before the intake to the heat exchanger 203 and a bypass 207 around the heat exchanger 203 to the pump 204 is placed before the valve 206.

A controller 208 monitors the workload 209 being applied to the semiconductor devices that are being cooled by the cold plates 202. If the controller 208 detects that the workload has fallen below some threshold, the controller 208 causes the valve 206 to partially or wholly close (according to various embodiments, described in more detail below, the more the workload falls, the closer the valve 206 is restricted to complete closure). With the partial or whole closure of the valve 206, some or all of the secondary fluid 201 does not flow through the heat exchanger 203 after having just absorbed some heat from the cold plates 202 that the secondary fluid 201 flows through.

Instead, such warmed secondary fluid flows through the bypass 207 to the pump 204. The warmed secondary fluid 201 is then pumped again through the cold plates 202 and absorbs more heat. The process then repeats with the secondary fluid 201 that bypasses 207 the heat exchanger 203 absorbing more heat with each trip through the secondary loop 201. As such, the temperature of the secondary fluid 201 will steadily rise over time.

Once the temperature of the secondary fluid 201 has suitably/appreciably risen (e.g., above some established threshold), the valve 206 is set to a new, more open state that causes more of the secondary fluid 201 to flow through the heat exchanger 203. As such, warmer secondary fluid 201 is run through the heat exchanger 203 (as compared to the temperature of the secondary fluid if the heat exchanger was not previously bypassed). With the primary fluid 205 receiving more heat from the warmer secondary fluid 201, the temperature of the primary fluid 205 ideally does not fall below some minimum threshold beneath which it cannot be used as a heat source.

In further embodiments the fluid flow through the primary loop 205 is lowered in conjunction with the bypassing of the heat exchanger 203 so that when the warmed secondary fluid 201 is permitted to flow again through the heat exchanger 203, the primary fluid 201 absorbs more heat per unit volume as it passes through the heat exchanger 203 (because with lower velocity, the primary fluid 205 spends more time per unit volume within the heat exchanger 203). With increased heat being absorbed by the primary fluid 205 as it passes through the heat exchanger 203, again, the temperature of the primary fluid 205 ideally does not fall below some minimum threshold.

In various embodiments, to account for unevenness in workload across electronic devices, the secondary fluid 201 is maintained at a high fluid flow rate. For example, assume that the secondary loop 201 is dedicated to the cooling of a rack of server computers and each of the separate parallel paths 210 in the secondary loop 201 corresponds to the dedicated coolant flow through a particular server computer that is installed in the rack. Here, the respective fluid that flows through each parallel leg of the secondary loop 201 can flow through multiple cold plates (each cold plate within a particular server).

It is possible that workload conditions will arise where one of the liquid cooled devices within one of the servers has high workload (and is therefore dissipating large amounts of heat) while the remaining liquid cooled devices in the server, as well as the remaining servers in the rack, have very little workload (and are dissipating only small amounts of heat). In this case, the overall amount of heat being generated by the rack's equipment will be low (all of the rack's liquid cooled devices, except one, are dissipating minimal heat).

However, because one of the devices is generating large amounts of heat, a high fluid flow rate is needed to properly remove that particular device's heat. As such, in various embodiments, the secondary pump 204 is not varied with electronic device workload, but rather, keeps pumping the secondary fluid 201 with a high fluid flow rate to ensure that if any devices are dissipating large amounts of heat, the heat will be properly removed from the device.

Nevertheless, continuing with the above example, with all other devices in the rack dissipating minimal heat, the overall secondary loop 201 receives little heat which prompts the partial or whole closure of the valve 206 and the bypass of the heat exchanger 203.

Figures 3A, 3B:
FIGS. 3a and 3b show valve setting and secondary loop temperature as a function of combined electronic device workload.

FIG. 3a shows an exemplary valve modulation curve 301 that, in various embodiments, is implemented by the controller 208 to keep the secondary fluid 201 sufficiently warm via bypassing of the heat exchanger 203 as described above. The horizontal axis corresponds to the combined workload of the electronic devices that are liquid cooled by the secondary loop 201. The vertical axis corresponds to the setting of the valve 206 (moving up the vertical axis corresponds to the valve being more open while moving down the vertical axis corresponds to the valve being more closed).

As observed in the valve modulation curve 301 of FIG. 3a, if the combined workload of the electronic devices surpasses a high level threshold 302, the valve is set to fully open and the secondary loop's operation is akin to a traditional secondary loop. By contrast, if the combined workload of the electronic devices falls below a low threshold 303, the valve 206 is fully closed and all of the secondary fluid bypasses the heat exchanger 203. If the combined workload is between the high 302 and low 303 thresholds, the valve 206 is partially opened where the valve 206 is opened more for higher combined workloads and less for lower combined workloads.

FIG. 3b shows the temperature of the secondary loop fluid 201 ("secondary loop temperature" and the like) at the exit ports of the cold plates 202 (point 221 in FIG. 2) that results from a particular valve setting for a particular combined workload. As observed in FIG. 3b, according to various embodiments, the secondary fluid temperature is approximately constant between the high and low workload thresholds 302, 303.

Here, if a new workload falls between the high 301 and low 302 thresholds, a decrease in workload is compensated for by bypassing more secondary fluid around the heat exchanger 203 thereby accumulating more heat within the secondary fluid 201, whereas, an increase in workload is compensated for by bypassing less fluid around the heat exchanger 203 thereby accumulating less heat within the secondary fluid 201 (more heat is removed from the secondary loop 201 by the heat exchanger 203). Importantly, the approximately constant temperature effected by the workload dependent bypassing activity (and primary flow rate adjustment) translates into a primary fluid 205 temperature that does not fall below a minimum threshold, even at low workloads.

In various embodiments, the approximately constant temperature is "designed for" in the sense that it is determinable from the volume of fluid in the secondary loop 201 and the flow rate that is effected by the pump 204. Importantly, the "designed for" temperature is consistent with an amount of heat that should be transferred into the primary loop 205 to keep the temperature of the primary loop 205 sufficiently high to meet its downstream use as a source of heat.

Figure 4:
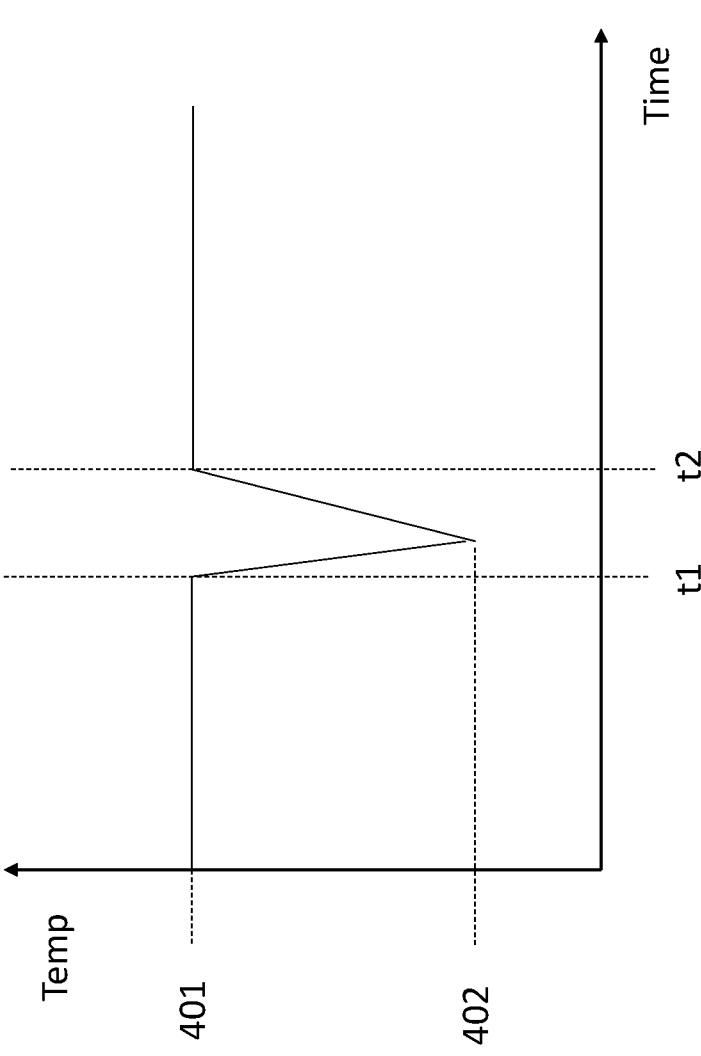
FIG. 4 shows dynamic secondary loop temperature changes in response to a change in combined electronic device workload.

FIG. 4 depicts an example of the dynamic behavior of the temperature of the secondary loop fluid at the outlets of the cold plates 202 (point 221 in FIG. 2). Initially, the electronic devices being cooled by the secondary loop have a higher combined workload and are dissipating larger amounts of heat. The larger amount of heat is transferred to the primary loop via the heat exchanger.

At time t1 the combined workload of the electronic devices suddenly drops and (ignoring thermal capacities of the cold plate assemblies for convenience) the temperature of the secondary loop fluid suddenly drops from the initial temperature 401 to a lower temperature 402 in response. Concurrent with the drop in workload at t1, however, is the closure of the valve 206 by the controller 208. With the valve 206 being closed, the heat exchanger 203 is completely bypassed and no heat is being removed from the secondary loop 201.

In the particular example being described, the workload before and after the drop in workload is assumed to be between the high and low thresholds. As such, from the initial lower temperature 402 after the drop in workload, the temperature of the secondary loop steadily rises over time until, at time t2, the temperature of the secondary fluid approximately reaches the designed for steady state temperature 401 described above with respect to the valve modulation curve 301 of FIG. 3a. Once the temperature of the secondary fluid approximately reaches the designed for steady state temperature 401, the controller switches the valve's setting to a value determined from the modulation curve 301 of FIG. 3a.

With the valve set to a value that results in the steady state temperature 401 being maintained for the new workload of the electronic devices, the temperature of the secondary fluid approximately remains at the steady state temperature thereafter (until a next workload change). Note that the workload prior to t1 was less than the high workload threshold 302 such that the initial temperature prior to t1 was also at the designed for steady state temperature 401.

If the drop in workload at t1 instead fell beneath the low workload threshold 303 of the valve modulation curve 301, the temperature of the secondary fluid will slowly rise from a temperature beneath temperature 401. In this case, the valve would be nearly closed resulting in no heat being removed from the secondary loop. In various embodiments, when the workload is below the low threshold and the valve is nearly closed, the slope of the temperature rise is small enough that a change in workload is expected before the temperature of the secondary loop reaches the steady state temperature. As such the controller 208 simply waits for the next workload change.

The above example described a drop in workload that caused the valve to be temporarily closed in order to keep the secondary fluid warm. By contrast, if the workload suddenly increases, the valve can immediately be set to the correct, more open setting based on the modulation curve 301 of FIG. 3a. The more open setting allows the additional heat being transferred to the secondary loop from the increased workload to be immediately transferred to the primary loop. As such, the temperature of the secondary fluid should remain at the designed for steady state (approximately) across the workload change.

In various embodiments, the secondary loop 201 and heat exchanger 203 cool the equipment (e.g., server computers) that is installed into a particular rack (the secondary loop 201 and heat exchanger 203 are dedicated to a particular rack).

The primary loop 205 by contrast loops through the respective heat exchangers of multiple racks.

Figure 5:
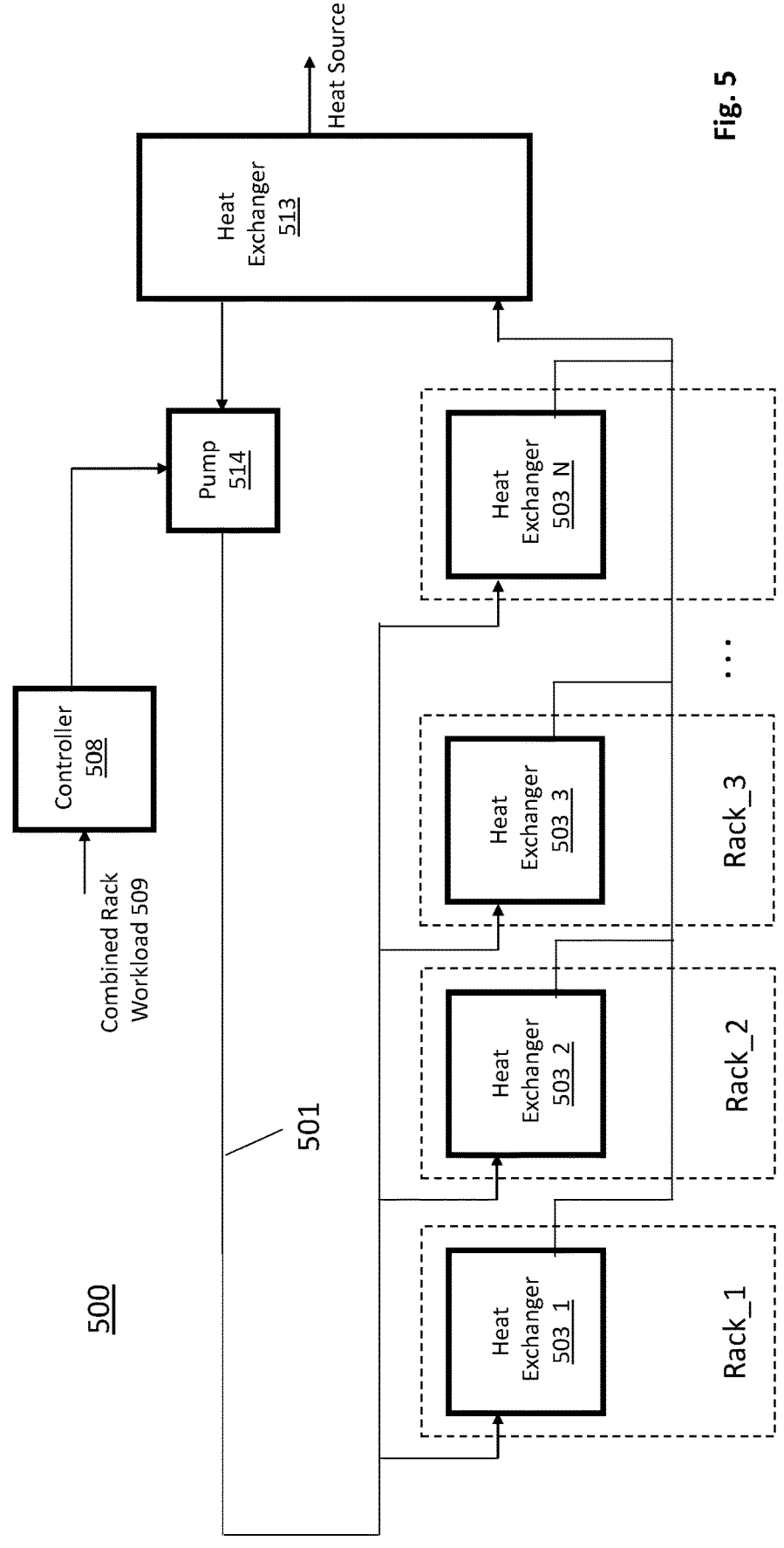
FIG. 5 shows an improved primary loop liquid cooling system.

FIG. 5 shows, e.g., a data center or other information system (IS) infrastructure arrangement 500 that includes multiple racks, each cooled with its own dedicated secondary loop and heat exchanger 503_x (the secondary loops within the racks are not depicted), where, a primary loop 501 runs through the respective heat exchangers 503_x of the multiple racks. Here, the heat exchanger 513 that cools the primary loop 501 extracts the heat removed from all of the racks and provides it as a heat source to downstream infrastructure as described above.

In various embodiments, the flow rate of the primary loop 501 is modulated by varying the flow rate of the primary pump 514 based on control from the controller 508, similar to the valve in the secondary loops, to ensure that the temperature of the primary loop fluid 501 remains sufficiently warm to act as a heat source.

FIG. 6a depicts an exemplary primary flow rate modulation curve 601 for the primary pump 514. The horizontal axis is the combined workload 509 of the electronic devices installed in the set of N racks that are cooled by the primary loop 501. The vertical axis is the flow rate through the primary loop 501 (moving up along the vertical axis corresponds to a faster primary pump 514 setting while moving down along the vertical axis corresponds to a slower primary pump 514 setting).

As observed in the flow rate modulation curve 601 of FIG. 6a, if the racks' combined workload 509 surpasses a high level threshold 602, the primary pump 514 is set to a maximum speed (which induces a maximum primary flow rate) and the primary loop's operation is akin to a traditional primary loop. By contrast, if the racks' combined workload 509 falls below a low threshold 603, the pump 514 is set to some minimum speed (which induces a minimum primary flow rate).

The flow rate of the primary loop 501 is modulated (by adjusting the primary pump's pumping rate) if the combined workload 509 is between the high and low thresholds 602, 603. Specifically, the primary flow rate is increased for higher combined workloads and lessened for lower combined workloads. Similar to the secondary loop's valve modulation, the modulation of the primary loop flow rate effects an approximately constant temperature of the primary fluid across a wide range of combined workloads including low workloads.

Importantly, the constant temperature induced by the flow rate modulation affectively prevents the primary loop temperature from falling beneath some threshold that prevents the heat from the primary loop 501 from being used as a reliable heat source.

Although embodiments above have focused on a single valve that precedes a heat exchanger where, as the valve closes, more and more fluid bypasses the heat exchanger, in other embodiments, a valve can be placed before the bypass such that, as the valve opens, more and more fluid bypasses the heat exchanger. Other embodiments can include a valve before the heat exchanger and a valve before the bypass (where both valves are controlled by the controller), e.g., to achieve precise control over the ratio of the volume of fluid that flows through the heat exchanger vs. the volume of fluid that flows through the bypass.

In various embodiments a secondary and/or primary controller is implemented as one or more semiconductor chips that execute program code (e.g., one or more processor chips, controller chips, etc.) written to cause the semiconductor chip(s) to implement the controller methods described above including processing valve and/or pump rate modulation curves based on combined workloads as described above. The curves themselves can be expressed as equations that are written in the code, coefficients for such equations and/or look-up tables that are stored on a storage medium. The semiconductor chip(s) can be components of any of the systems that are cooled by the liquid cooled cooling apparatus. In various embodiments a primary loop controller and at least one secondary loop controller are implemented with same controller hardware and/or software.

Although embodiments above focused on an embodiment where the different, parallel fluid channels 210 within a secondary loop corresponded to different servers (or other equipment) mounted in a single rack, the teachings above could be applied to different arrangements such as to name a few: 1) the different, parallel fluid channels correspond to different groups of devices within a same electronic system; 2) the different, parallel fluid channels correspond to different racks of equipment.

Figure 7:
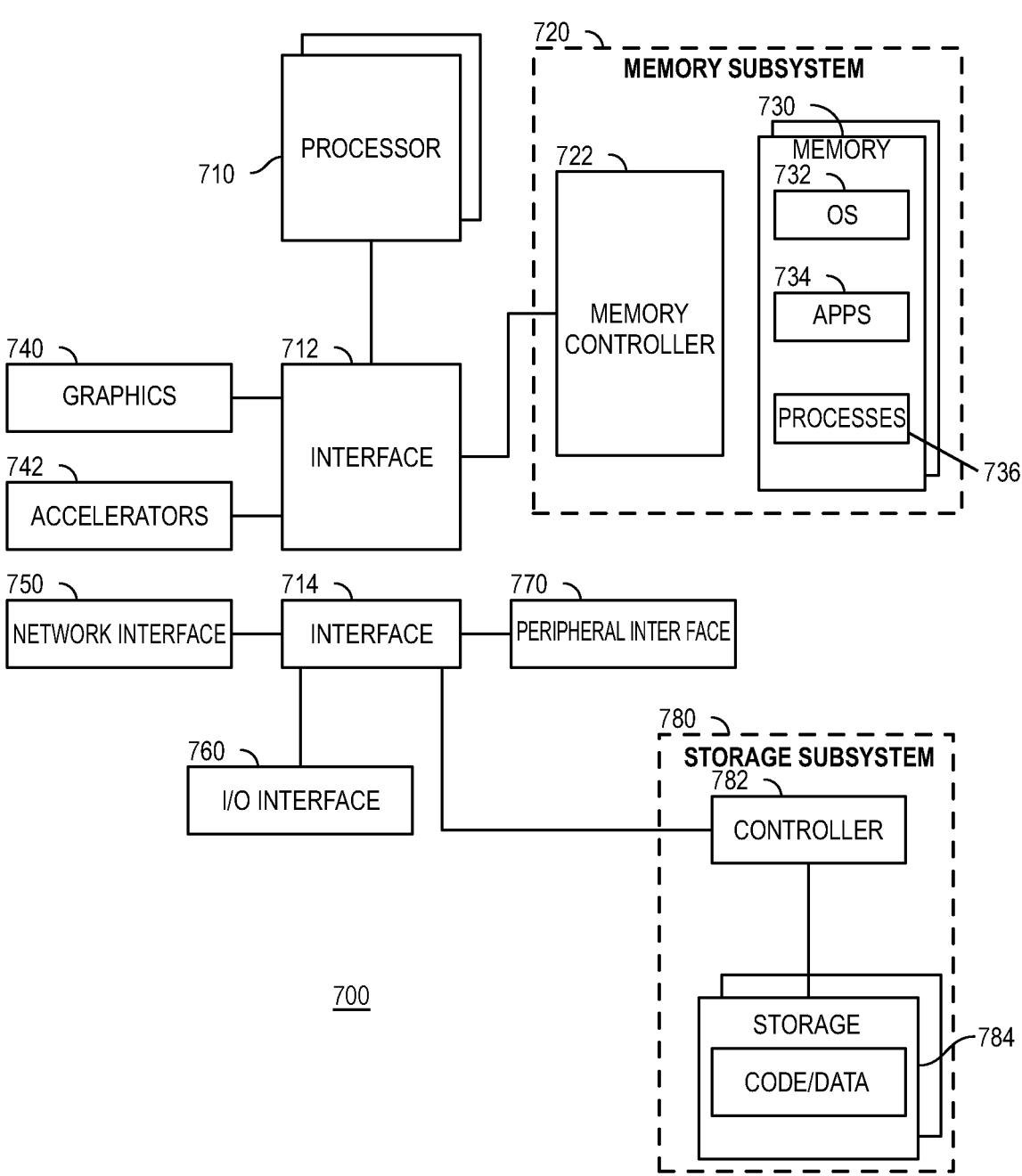
FIG. 7 shows a system.
Figure 8:
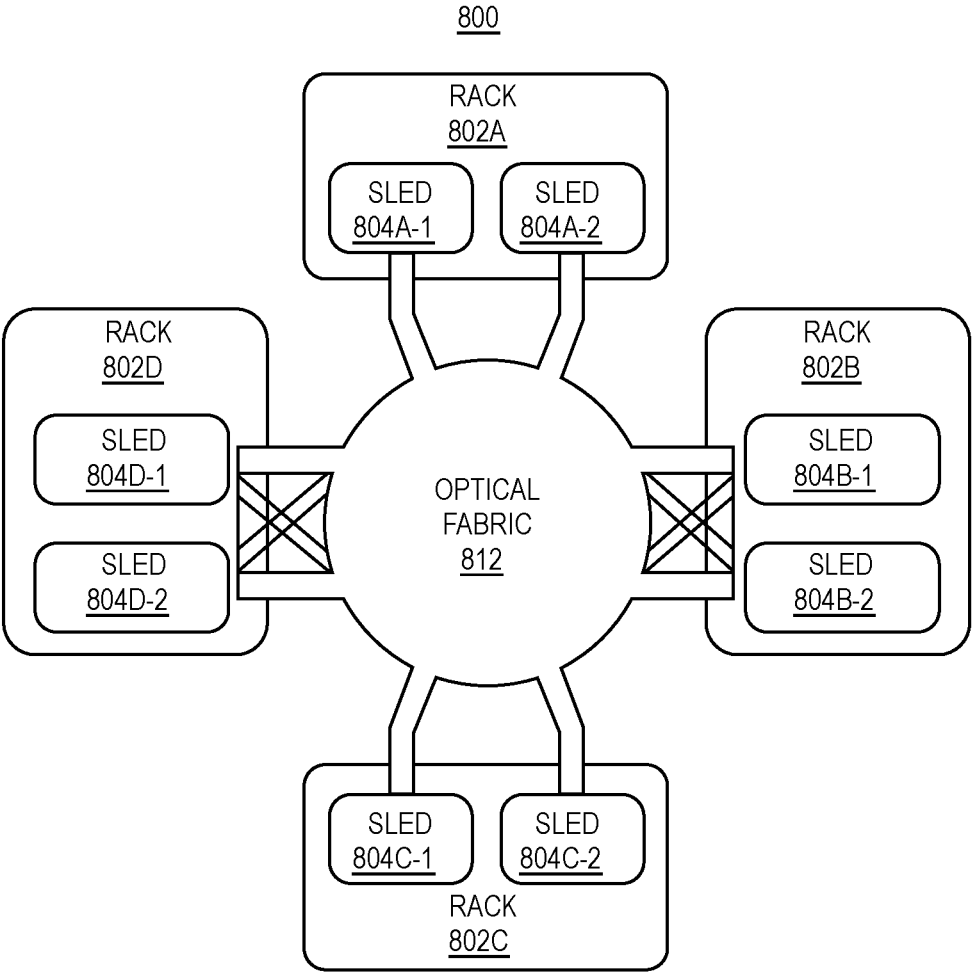
FIG. 8 shows a data center.
Figure 9:
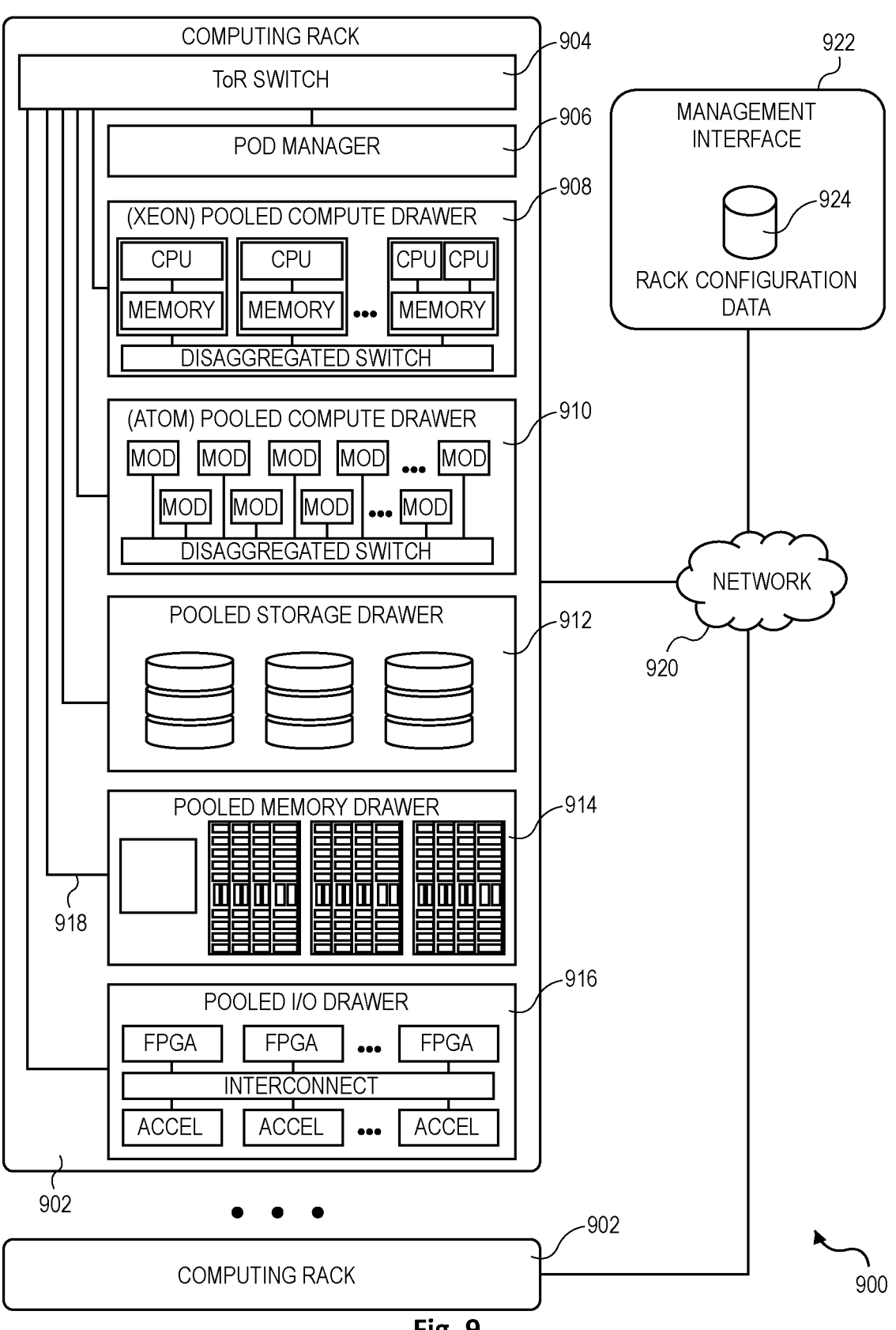
FIG. 9 shows a rack.

The following discussion concerning FIGS. 7, 8, and 9 are directed to systems, data centers and rack implementations, generally. FIG. 7 generally describes possible features of an electronic system that can include one or more semiconductor chip packages having a cooling assembly that is designed according to the teachings above. FIG. 8 describes possible features of a data center that can include such electronic systems. FIG. 9 describes possible features of a rack having one or more such electronic systems installed into it.

FIG. 7 depicts an example system. System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 700 includes interface 712 coupled to processor 710, which can represent a higher speed interface or a high throughput interface for system components that needs higher bandwidth connections, such as memory subsystem 720 or graphics interface components 740, or accelerators 742. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Accelerators 742 can be a fixed function offload engine that can be accessed or used by a processor 710. For example, an accelerator among accelerators 742 can provide compression (DC) capability, cryptography services such as public key encryption (PKE), cipher, hash/authentication capabilities, decryption, or other capabilities or services. In some embodiments, in addition or alternatively, an accelerator among accelerators 742 provides field select controller capabilities as described herein. In some cases, accelerators 742 can be integrated into a CPU socket (e.g., a connector to a motherboard or circuit board that includes a CPU and provides an electrical interface with the CPU). For example, accelerators 742 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 742 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 720 represents the main memory of system 700 and provides storage for code to be executed by processor 710, or data values to be used in executing a routine. Memory subsystem 720 can include one or more memory devices 730 such as read-only memory (ROM), flash memory, volatile memory, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software functionality to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

The memory resources can also be tiered (different access times are attributed to different regions of memory), disaggregated (memory is a separate (e.g., rack pluggable) unit that is accessible to separate (e.g., rack pluggable) CPU units), and/or remote (e.g., memory is accessible over a network).

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 700 includes interface 714, which can be coupled to interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices)

over one or more networks. Network interface 750 can include an Ethernet adapter, wireless interconnection components, cellular network interconnection components, USB (universal serial bus), or other wired or wireless standards-based or proprietary interfaces. Network interface 750 can transmit data to a remote device, which can include sending data stored in memory. Network interface 750 can receive data from a remote device, which can include storing received data into memory. Various embodiments can be used in connection with network interface 750, processor 710, and memory subsystem 720.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data in a persistent state (e.g., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (e.g., the value or state of the data is indeterminate if power is interrupted to system 700). In one example, storage subsystem 780 includes controller 782 to interface with storage 784. In one example controller 782 is a physical part of interface 714 or processor 710 or can include circuits in both processor 710 and interface 714.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base, and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall)

and SOT (Spin Orbit Transfer) based device, a thyristor based memory device, or a combination of any of the above, or other memory.

Such non-volatile memory devices can be placed on a DIMM and cooled according to the teachings above.

A power source (not depicted) provides power to the components of system 700. More specifically, power source typically interfaces to one or multiple power supplies in system 700 to provide power to the components of system 700. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 700 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 7, other types of systems to which the above described invention can be applied and are also partially or wholly described by FIG. 7 are communication systems such as routers, switches, and base stations.

FIG. 8 depicts an example of a data center. Various embodiments can be used in or with the data center of FIG. 8. As shown in FIG. 8, data center 800 may include an optical fabric 812. Optical fabric 812 may generally include a combination of optical signaling media (such as optical cabling) and optical switching infrastructure via which any particular sled in data center 800 can send signals to (and receive signals from) the other sleds in data center 800. However, optical, wireless, and/or electrical signals can be transmitted using fabric 812. The signaling connectivity that optical fabric 812 provides to any given sled may include connectivity both to other sleds in a same rack and sleds in other racks.

Data center 800 includes four racks 802A to 802D and racks 802A to 802D house respective pairs of sleds 804A-1 and 804A-2, 804B-1 and 804B-2, 804C-1 and 804C-2, and 804D-1 and 804D-2. Thus, in this example, data center 800 includes a total of eight sleds. Optical fabric 812 can provide sled signaling connectivity with one or more of the seven other sleds. For example, via optical fabric 812, sled 804A-1 in rack 802A may possess signaling connectivity with sled 804A-2 in rack 802A, as well as the six other sleds 804B-1, 804B-2, 804C-1, 804C-2, 804D-1, and 804D-2 that are distributed among the other racks 802B, 802C, and 802D of data center 800. The embodiments are not limited to this example. For example, fabric 812 can provide optical and/or electrical signaling.

FIG. 9 depicts an environment 900 that includes multiple computing racks 902, each including a Top of Rack (ToR) switch 904, a pod manager 906, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 908, and INTEL® ATOM™ pooled compute drawer 910, a pooled storage drawer 912, a pooled memory drawer 914, and a pooled I/O drawer 916. Each of the pooled system drawers is connected to ToR switch 904 via a high-speed link 918, such as a 40 Gigabit/second (Gb/s) or 100 Gb/s Ethernet link or an 100+Gb/s Silicon Photonics (SiPh) optical link. In one embodiment high-speed link 918 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 900 may be interconnected via their ToR switches 904 (e.g., to a pod-level switch or data center switch), as illustrated by connections to a network 920. In some embodiments, groups of computing racks 902 are managed as separate pods via pod manager(s) 906. In one embodiment, a single pod manager is used to manage all of the racks in the pod. Alternatively, distributed pod managers may be used for pod management operations. RSD environment 900 further includes a management interface 922 that is used to manage various aspects of the RSD environment. This includes managing rack configuration, with corresponding parameters stored as rack configuration data 924.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds, and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled, and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software, and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:

a pump;

a plurality of cold plates through which fluid pumped by the pump is to flow, the cold plates to receive heat from respective electronic devices;

a heat exchanger to receive a first portion of the fluid after the fluid flows through the cold plates;

a bypass around the heat exchanger, the bypass to receive a second portion of the fluid after the fluid flows through the cold plates;

a valve, the valve downstream of an intake of the bypass and upstream of an intake of the heat exchanger; and at least one programmable circuit communicatively coupled to the valve, one or more of the at least one programmable circuit to determine a valve setting based on power consumption of one or more of the electronic devices, the valve setting defining a degree to which the valve is open, the first portion of the fluid and the second portion of the fluid defined based on the valve setting.

2. The apparatus of claim 1, wherein the valve setting is a first valve setting, the first valve setting defining a first amount of the first portion of the fluid and a second amount of the second portion of the fluid, and one or more of the at least one programmable circuit is to:

detect an increase in the power consumption of a first one of the electronic devices; and adjust the first valve setting to a second valve setting to cause the first amount of the first portion of the fluid to increase and the second amount of the second portion of the fluid to decrease.

3. The apparatus of claim 2, wherein one or more of the at least one programmable circuit is to:

detect a decrease in the power consumption of the first one of the electronic devices; and adjust the second valve setting to the first valve setting to cause the first amount of the first portion of the fluid to decrease and the second amount of the second portion of the fluid to increase.

4. The apparatus of claim 1, wherein one or more of the at least one programmable circuit is to cause a temperature of the first portion of the fluid to remain above a minimum threshold for a plurality of different power consumptions of the electronic devices.

5. The apparatus of claim 1, wherein one or more the at least one programmable circuit is a component of one of the electronic devices.

6. The apparatus of claim 1, wherein the electronic devices are within a same rack.

7. The apparatus of claim 1, wherein the pump is to maintain a flow rate to cool the respective electronic devices, the flow rate based on operation of the respective electronic devices at maximum power.

8. A data center, comprising:

a plurality of racks including electronic systems, the respective electronic systems including electronic devices that are cooled by respective cold plates;

a plurality of secondary loop heat exchangers to receive respective first portions of secondary loop fluid from respective ones of the cold plates, the plurality of secondary loop heat exchangers including a first secondary loop heat exchanger;

fluidic bypasses around corresponding ones of the secondary loop heat exchangers to receive respective second portions of the secondary loop fluid, the fluidic bypasses including a first fluidic bypass, the first portions of the secondary loop fluid and the second portions of the secondary loop fluid determined from respective settings of respective valves, the valves including a first valve, the first valve downstream of an intake of the first fluidic bypass and upstream of an intake of the first secondary loop heat exchanger;

a primary loop including a primary heat exchanger, a pump, and respective fluidic channels that flow through the plurality of secondary loop heat exchangers, the primary heat exchanger to provide a source of heat; and at least one programmable circuit to determine the respective settings of the valves and a pump rate of the pump based on power consumption of the respective electronic devices of corresponding ones of the racks so that the heat remains above a threshold, the respective settings of the valves defining a degree to which the valves are open.

9. The data center of claim 8, wherein the settings of the respective valves include a first valve setting for the first valve, the first valve setting defining a first amount of the first portion of the secondary loop fluid associated with the first secondary loop heat exchanger and a second amount of the second portion of the secondary loop fluid associated with the first fluidic bypass, and one or more of the at least one programmable circuit is to:

detect an increase in the power consumption for a subset of the electronic devices, wherein the heat of the electronic devices in the subset is transferred to the primary loop by the first secondary loop heat exchanger; and adjust the first valve setting to a second valve setting to cause the first amount of the first portion of the secondary loop fluid to increase and the second amount of the second portion of the secondary loop fluid to decrease.

10. The data center of claim 9, wherein one or more of the at least one programmable circuit is to:

detect a decrease in the power consumption for the subset of the electronic devices; and adjust the second valve setting to the first valve setting to cause the first amount of the first portion of the secondary loop fluid to decrease and the second amount of the second portion of the secondary loop fluid to increase.

11. The data center of claim 8, wherein one or more of the at least one programmable circuit is to cause the pump rate to decrease responsive to a decrease in the power consumption of the respective electronic devices across the plurality of racks.

12. The data center of claim 11, wherein one or more of the at least one programmable circuit is to cause the pump rate to increase responsive to an increase in the power consumption of the respective electronic devices across the plurality of racks.

13. The data center of claim 8, wherein one or more of the at least one programmable circuit is to cause the heat to remain above the threshold across a range of power consumptions across the plurality of racks.

14. The data center of claim 8, wherein one or more of the at least one programmable circuit is a component of one of the electronic devices.

15. A machine-readable storage medium comprising machine-readable instructions to cause at least one programmable circuit to at least:

monitor a power consumption of one or more electronic devices that are being cooled by a secondary loop;

cause a first portion of secondary fluid to flow through a heat exchanger and bypassing a second portion of the secondary fluid around the heat exchanger;

in response to an increase in the power consumption of the one or more of electronic devices, adjust a first setting of a valve to increase a first amount of the first portion of the secondary fluid and decrease a second amount of the second portion of the secondary fluid, the valve located downstream of an intake of a bypass of the heat exchanger and upstream of an intake of the heat exchanger; and in response to a decrease in the power consumption of the one or more electronic devices, adjust a second setting of the valve to decrease the first amount of the first portion of the secondary fluid and increase the second amount of the second portion of the secondary fluid.

16. The machine-readable storage medium of claim 15, wherein the adjustment of the first setting of the valve is to cause the secondary fluid to reach a temperature above a threshold.

17. The machine-readable storage medium of claim 16, wherein the adjustment of the second setting of the valve is to cause the secondary fluid to reach the temperature above the threshold.

18. The machine-readable storage medium of claim 15, wherein the machine-readable instructions are to cause one or more of the at least one programmable circuit to monitor the power consumption of the one or more electronic devices and one or more other electronic devices that are being cooled by another secondary loop.

19. The machine-readable storage medium of claim 18, wherein the secondary loop is a first secondary loop, the heat exchanger is a first heat exchanger, and the machine-readable instructions are to cause one or more of the at least one programmable circuit to cause a rate of fluid flow through the first heat exchanger and a second heat exchanger of the other secondary loop to decrease responsive to a decrease in the power consumption of the one or more electronic devices that are being cooled by the first secondary loop and the one or more other electronic devices that are being cooled by the other secondary loop.

20. The machine-readable storage medium of claim 19, wherein the machine-readable instructions are to cause one or more of the least one programmable circuit to cause the rate of fluid flow through the first heat exchanger of the first secondary loop and the second heat exchanger of the other secondary loop to increase responsive to an increase in the power consumption of the one or more electronic devices that are being cooled by the first secondary loop and the one or more other electronic devices that are being cooled by the other secondary loop.

21. The machine-readable storage medium of claim 15, wherein the machine-readable instructions are to cause a flow rate of the secondary loop to be maintained to cool the electronics devices, the flow rate based on operation of the respective electronic devices at maximum power.

* * * * *